(12) United States Patent
Jiang et al.

(10) Patent No.: US 6,710,456 B1
(45) Date of Patent: Mar. 23, 2004

(54) COMPOSITE INTERPOSER FOR BGA PACKAGES

(75) Inventors: Tongbi Jiang, Boise, ID (US); Edward Schrock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 326 days.

(21) Appl. No.: 09/652,977

(22) Filed: Aug. 31, 2000

(51) Int. Cl.[7] .............................................. H01L 29/40
(52) U.S. Cl. ........................................ 257/778; 257/737
(58) Field of Search ................................ 257/737, 738, 257/778, 712, 666

(56) References Cited

U.S. PATENT DOCUMENTS

| | | | |
|---|---|---|---|
| 4,670,325 A | | 6/1987 | Bakos et al. |
| 5,045,921 A | | 9/1991 | Lin et al. |
| 5,148,266 A | | 9/1992 | Khandros et al. |
| 5,216,278 A | | 6/1993 | Lin et al. |
| 5,591,034 A | * | 1/1997 | Ameen et al. ............... 439/91 |
| 5,659,952 A | | 8/1997 | Kovac et al. |
| 5,821,609 A | | 10/1998 | DiStefano et al. |
| 5,879,965 A | | 3/1999 | Jiang et al. |
| 5,990,545 A | * | 11/1999 | Schueller et al. ........... 257/697 |
| 6,012,224 A | | 1/2000 | DiStefano et al. |
| 6,211,277 B1 | * | 4/2001 | Kawata et al. .............. 524/492 |
| 6,312,801 B1 | * | 11/2001 | Kim et al. ................... 428/355 |
| 6,551,676 B1 | | 4/2003 | Yamakawa et al. |

OTHER PUBLICATIONS

"Area Tape Automated Bonding Ball Grid Array Technology" by Chin–Ching Huang and Ahmad Hamzehdoost, Ball Grid Array Technology, Chapter 14, pp. 443–464 (1995).
"Face–down BGA shrinks memory products by 75%", by Spencer Chin, Outlook.
"Tessera's Micro–Ball Grid Array (µBGA)", Chapter 16, pp. 259–282.
"Advanced Encapsulant Systems for Flip–Chip–on–Board Assemblies: Underfills with Improved manufacturing Properties" by Daniel R. Gamota and Cindy M. Melton, IEEE Transactions on Components, Packaging, and Manufacturing Technology—Part C, vol. 21, No. 3, Jul. 1998.

* cited by examiner

Primary Examiner—Roy Potter
(74) Attorney, Agent, or Firm—Knobbe, Martens, Olson & Bear, LLP (57) ABSTRACT

An interposer in a BGA or similar package includes a polymide core and a filler of thermally conductive, electrically nonconductive filler. The interposer has a higher thermal conductivity as compared to conventional interposers, thereby increasing the thermal dissipation through the interposer and enabling the device to cool more efficiently. The filler also reduces the coefficient of thermal expansion of the interposer to more closely match the die and reduce stresses. Furthermore, the filler increases the rigidity of the interposer, thereby enabling the interposer to be handled and carried more easily, for example, without a metal frame carrier.

37 Claims, 6 Drawing Sheets

COMPOSITE INTERPOSER FOR BGA PACKAGES

BACKGROUND OF THE INVENTION

1. Field of the Invention

The present invention relates to integrated circuit packages, and more particularly, to an interposer for a ball grid array (BGA) package having high thermal dissipation, a low coefficient of thermal expansion (CTE) and a high Young's modulus.

2. Description of the Related Art

In the last few decades, the electronics industry has literally transformed the world. Electronic products are used by, or affect the daily lives of, a large segment of the world's population. For example, telephones, televisions, radios, personal computers (PCs), laptop PCs, palmtop PCs, PCs with built-in portable phones, cellular phones, wireless phones, pagers, modems and video camcorders, are just a few of the electronic products that have been developed in recent years and which have been made smaller and more compact, while providing more functions than ever before and/or enhanced functions. The integrated circuit (IC) chip and the more efficient packaging of the IC chip have played key roles in the success of these products.

The IC chip is not an isolated island. It must communicate with other chips in a circuit through an Input/Output (I/O) system of interconnects. Moreover, the IC chip and its embedded circuitry are delicate, and must therefore be protected in a package that can both carry and protect it. As a result, the major functions of the IC package are: (1) to provide a path for the electrical current that powers the circuits on the chip; (2) to distribute the signals on to and off of the chip; (3) to remove the heat generated by the circuit; and (4) to support and protect the chip from hostile environments.

As ICs become more complex and printed circuit boards become more crowded, IC packages continually need more leads or pins while their footprints consume smaller and smaller areas. In an effort to meet these demands, developers created the ball grid array (BGA) package.

A typical BGA package includes an IC affixed to a flexible polyimide tape or interposer. A very thin conductor or wire bond connects a pad on the IC to a conductive trace on the polyimide tape. The conductive trace is routed to a solder ball. The solder ball is one of an array of solder balls mounted to the opposite side of the polyimide tape and protruding from the bottom of the BGA package. These solder balls interconnect with an array of pads located on a substrate, such as a printed circuit board. Accordingly, the typical BGA package electrically connects each pad on an IC to a pad on a printed circuit board.

A variation of the BGA package that has been introduced recently is the Area Tape Automated Bonding (ATAB) Ball Grid Array (BGA) package, or more commonly referred to as simply the Tape Ball Grid Array (TBGA) package. The TBGA package advantageously provides high lead counts, is thin, is lightweight, has high electrical and thermal performance, and has a BGA surface mount. The conventional TBGA package includes a tape containing a polyimide dielectric. At least one layer of the tape is formed into traces or conductors that interconnect a chip to a printed circuit board (PCB). See John H. Lau (Ed.), Ball Grid Array Technology, Chapter 14, "Area Tape Automated Bonding Ball Grid Array Technology" (McGraw-Hill, 1995), incorporated herein by reference.

One particular type of BGA package developed by Tessera is the micro-ball grid array ($\mu$BGA) package. The basic package typically includes a package interposer that is a 25 $\mu$m thick polyimide film with double-sided copper (Cu). One side of the Cu serves as a ground plane, which the other side has signal traces for I/O redistribution. A layer of silicone elastomer is positioned between the chip and the substrate. This compliant layer typically has a thickness of 150 $\mu$m. The first-level interconnects of the $\mu$BGA are flexible ribbons which are typically bonded on aluminum (Al) bond pads on the chip by a single-shot thermosonic process. The ribbons are typically 25 $\mu$m-wide soft gold (Au) leads with a thickness of 20 to 25 $\mu$m, bonded in a lazy-S shape so that they may accommodate any deformation due to thermal expansion. In order to protect the bonded leads, an encapsulant such as a silicone material is dispensed from the back side (between the chip and the interposer) after the lead bonding is completed. The package terminals of the PBGA may be plated bumps, solder balls or solid-core metal spheres. Further details describing the typical $\mu$BGA package may be found in John H. Lau, Chip Scale Package, Chapter 16, "Tessera's Micro-Ball Grid Array ($\mu$BGA)" (McGraw-Hill, 1999), incorporated herein by reference.

In a typical $\mu$BGA manufacturing process, the flexible tape interposer is first provided and tailored from a reel to mount as strips onto a metal frame. The elastomer layer is applied to the tape, and an adhesive material is deposited for die attachment. Die attachment is performed with an automated pick-and-place machine. Subsequently, ribbon leads are bonded to the Al die pads by a thermosonic process. Once the lead bonding is finished, a dry film resist is laminated to the interposer using a vacuum system. The encapsulant is dispensed from the back side, and the curing is performed to complete the encapsulation. The subsequent procedures include dry film exposure and developing, solder-ball attachment and reflow, cleaning, marking, and package singulation. Further details are described in Chapter 16 of John Lau's Chip Scale Package referenced above.

One problem with integrated circuits, including BGA packages, is that they require precise temperature control for efficient operation. Thus, if a package runs too hot, the heat can affect the performance and timing of the device. Accordingly, there is a need for an effective way to maintain control over the temperature of a device and keep it cool.

Another problem in BGA and similar packages is the mismatch in coefficient of thermal expansion (CTE) between the die and the tape or interposer containing the polyimide dielectric. The polyimide tape typically has a much higher coefficient than that of the die to which the tape is bonded. For instance, a die having a CTE of about 3 ppm/° C. may be coupled to a polyimide tape interposer having a CTE of about 20 ppm/° C. or more. This mismatch causes the tape to expand and shrink more rapidly than the die, thereby creating stress on the conductive leads connecting the solder ball array to the die. This stress can lead to breakage of the wire and a corresponding loss of electrical connection between the IC pads. The mismatch in CTE between the interposer and the die can also lead to delamination of the die attach or elastomer layer found therebetween. These problems result in lower yield rates and increase the overall cost of package manufacture.

SUMMARY OF THE INVENTION

Briefly stated, the preferred embodiments of the present invention address these and other problems by providing an interposer in a BGA or similar package comprising a polymide core and a filler of thermally conductive, electrically nonconductive filler. This improved interposer has a higher thermal conductivity as compared to conventional interposers, thereby increasing the thermal dissipation through the interposer and enabling the device to cool more efficiently. The filler also reduces the CTE of the interposer to more closely match the die and reduce stresses. Furthermore, the filler increases the rigidity of the interposer, thereby enabling the interposer to be handled and carried more easily, for example, without a metal frame carrier.

In one aspect of the present invention, an interposer for an integrated circuit package is provided. The interposer comprises a polyimide core and a thermally conductive, electrically nonconductive filler. Preferably, the interposer includes between about 10% and 95% filler by weight. More preferably, this filler may be either boron nitride or alumina. The filler advantageously increases the thermal conductivity of the interposer by at least about 50% as compared to that of the polyimide core alone. The filler also advantageously reduces the coefficient of thermal expansion of the interposer by at least about 10% as compared to the polyimide core alone. Furthermore, the filler advantageously increases the modulus of the interposer by at least about 10% as compared to the modulus of the polyimide core alone.

In another aspect of the present invention, a flexible tape for connecting a die to a plurality of package terminals is provided. The tape comprises a polyimide core and a filler material. The filler material increases the thermal conductivity of the tape as compared to the thermal conductivity of the polyimide core alone.

In another aspect of the present invention, an integrated circuit package is provided. This package comprises a die, a die attach layer over the die, an array of package terminals over the die attach layer, and a composite tape between the die attach layer and the array of package terminals. The composite tape comprises a polyimide core and a thermally conductive filler embedded therein. The composite tape further comprises a layer of metal wire electrically connected to the die.

In another aspect of the present invention, a method of increasing the thermal conductivity of a flexible tape for use in an integrated circuit is provided. This method comprises adding a filler of thermally conductive material to a polyimide film. In one preferred embodiment, the filler is added by blending the filler into a polyimide resin.

DETAILED DESCRIPTION OF THE PREFERRED EMBODIMENTS

The embodiments described herein particularly relate to an interposer connecting a die to a solder ball array in a μBGA package. However, it will be appreciated that the principles of the present invention pertain not only to μBGA technology, but also to other BGA, TBGA or flexible circuitry and other integrated circuit packaging. For example, the principles of the present invention are also applicable to Micron's BOC (Board-on-Chip) package.

As described in greater detail below, the preferred interposer comprises a polyimide core and a thermally conductive, electrically nonconductive filler. By adding filler to the polyimide core, the thermal conductivity of the interposer increases allowing the interposer to dissipate heat more effectively. In addition, the coefficient of thermal expansion (CTE) of the interposer is reduced to more closely match the die. Moreover, the filler increases the rigidity of the interposer, making the interposer more durable to handling, which can eliminate the need for the metal frame carrier process that is used with conventional interposers to attach the tape to the die.

Figure 1A:
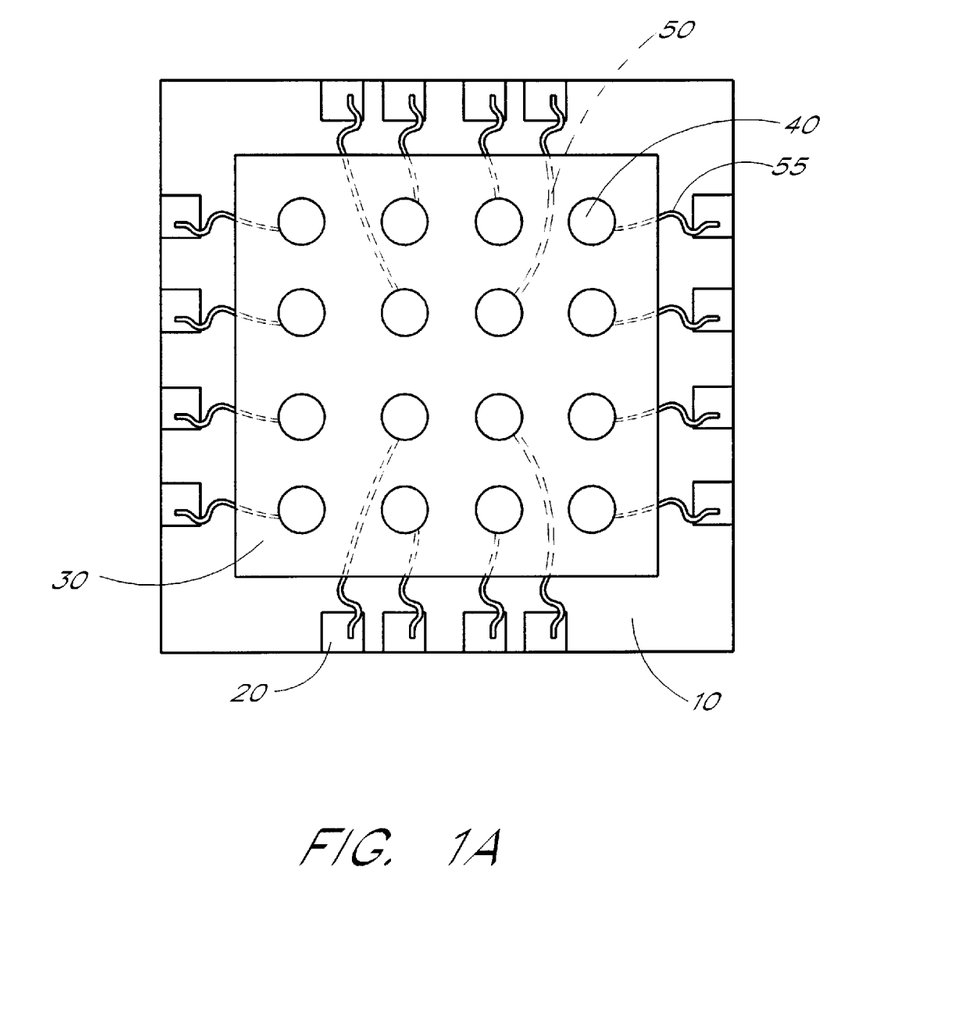
FIG. 1A shows a bottom view of a face-down, fan-in package employing an expansion lead, according to one embodiment of the present invention.
Figure 1B:
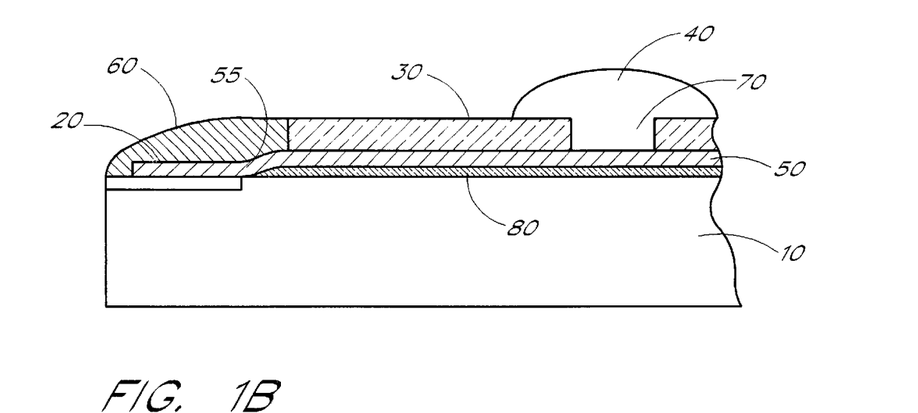
FIG. 1B shows a fragmentary cross-sectional view of a face-down, fan-in package employing an expansion lead, according to one embodiment of the present invention.

FIGS. 1A and 1B show a face view and a fragmentary cross-sectional view, respectively, of a chip 10 having a plurality of chip contacts 20 on a contact bearing surface. A sheet-like dielectric chip carrier substrate 30 overlies and is typically centrally located on the contact bearing surface of the chip 10 so that the chip contacts 20 are exposed. The substrate 30 may merely overlie the contact bearing surface of the chip 10; however, typically, the substrate is adhesively attached to the chip surface using a thin layer of adhesive material 80, as shown in FIG. 1B.

The substrate 30 may comprise a rigid or flexible material. Preferably, the substrate comprises a sheet of polyimide having a thickness approximately between 25 and 100 microns. The first surface of the substrate 30 has a plurality of conductive terminals 40 thereon. The terminals 40 are electrically connected to a chip contact 20 through respective conductive leads 50 extending along the opposite side of the substrate and connected to the leads 50 through conductive vias 70. Alternately, the substrate may simply be removed so that solder ball terminals are placed directly onto the ends of the leads 50 without requiring the conductive vias 70.

Each lead 50 has an expansion section 55 extending from an edge of the substrate 30. Each expansion section is bonded to a respective chip contact 20, typically using conventional ultrasonic or thermosonic bonding apparatus. Each expansion section 55 is laterally curved substantially parallel to the plane of the substrate 30 prior to the bonding operation. Preferably, each expansion section 55 laterally curves at least twice in opposite directions (substantially "s" shaped) and may be curved more than twice. The leads 50 may further be detachably connected to a supporting structure prior to bonding as disclosed in U.S. Pat. Nos. 5,489,749 and 5,536,909, which are hereby incorporated by reference in their entirety.

Typically, the expansion sections 55 of the leads are encapsulated by a suitable encapsulant, such as silicone or epoxy, to protect them from contamination and damage. During operation of the packaged chip, the terminals are attached to a printed circuit board and the laterally curved shape of the expansion sections 55 of the leads 50 helps to compensate for the expansion and contraction of the chip during thermal cycling by having the ability to independently flex and bend. The aforementioned encapsulant 60 supports the expansion sections 55 of the leads 50 as they flex and bend and further helps to spread the forces acting on the leads. Further, a solder mask or coverlay may be placed over the exposed surface of the substrate 30 after the bonding and encapsulation steps such that only the terminals are exposed.

Figure 1C:
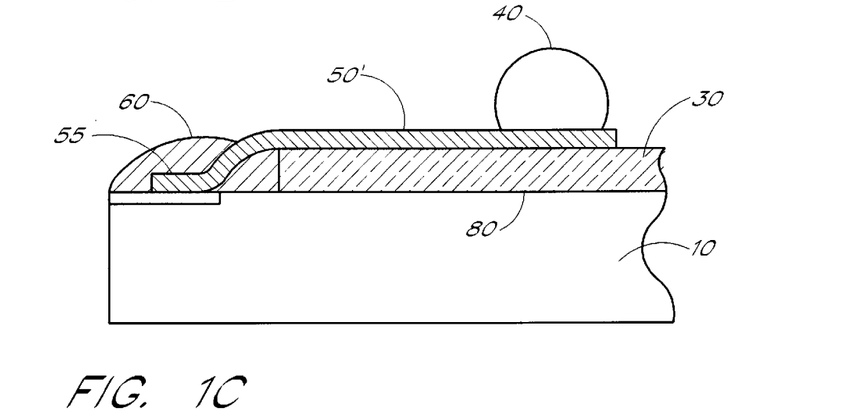
FIG. 1C shows a fragmentary cross-sectional view of a face-down, fan-in package employing an expansion lead having the leads on the second surface of the substrate, according to one embodiment of the present invention.

FIG. 1C shows a fragmentary cross-sectional view of an alternate embodiment in which the leads 50' are located on the same side as the terminals 40; thus, not requiring the conductive vias 70 (shown in FIG. 1B). A solder mask/coverlay is also used in the embodiment shown in FIG. 1C because the leads 50 and the terminals 40 are on the same side of the substrate 30. The solder mask/coverlay provides a dielectric coating ensuring that the solder connecting the terminals to contacts on the printed circuit board does not wick down the leads or short to other soldered terminals.

Figure 1D:
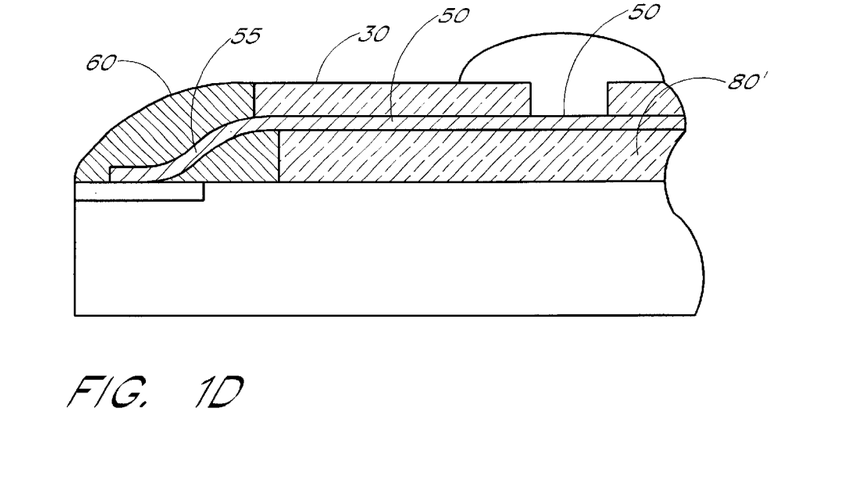
FIG. 1D shows a fragmentary cross-sectional view of a face-down, fan-in package employing an expansion lead wherein a compliant layer is disposed between the face surface of the chip and the first surface of the substrate, according to one embodiment of the present invention.

FIG. 1D shows a fragmentary cross-sectional view of an alternate embodiment in which the thin layer of adhesive from FIG. 1B has been replaced with a thicker layer of compliant material 80' to give added compensation for thermal mismatch, as disclosed in U.S. Pat. Nos. 5,148,265 and 5,148,266, which are hereby incorporated by reference in their entirety. The compliant material 80' is typically about 50 to 200 microns thick and comprises either a thermoset or a thermoplastic material. The structure shown in FIG. 1D also allows the expansion sections 55 of the leads 50 to be shaped by the bonding operation so that they are curved in a direction perpendicular to the lateral curve of the leads 50. As stated above, these laterally and vertically curved leads are typically supported by the encapsulant 60 so as to spread the forces acting upon them during thermal cycling of the operational package. Further details regarding these and other embodiments are disclosed in U.S. Pat. No. 5,821,608, the entirety of which is hereby incorporated by reference.

Figure 2:
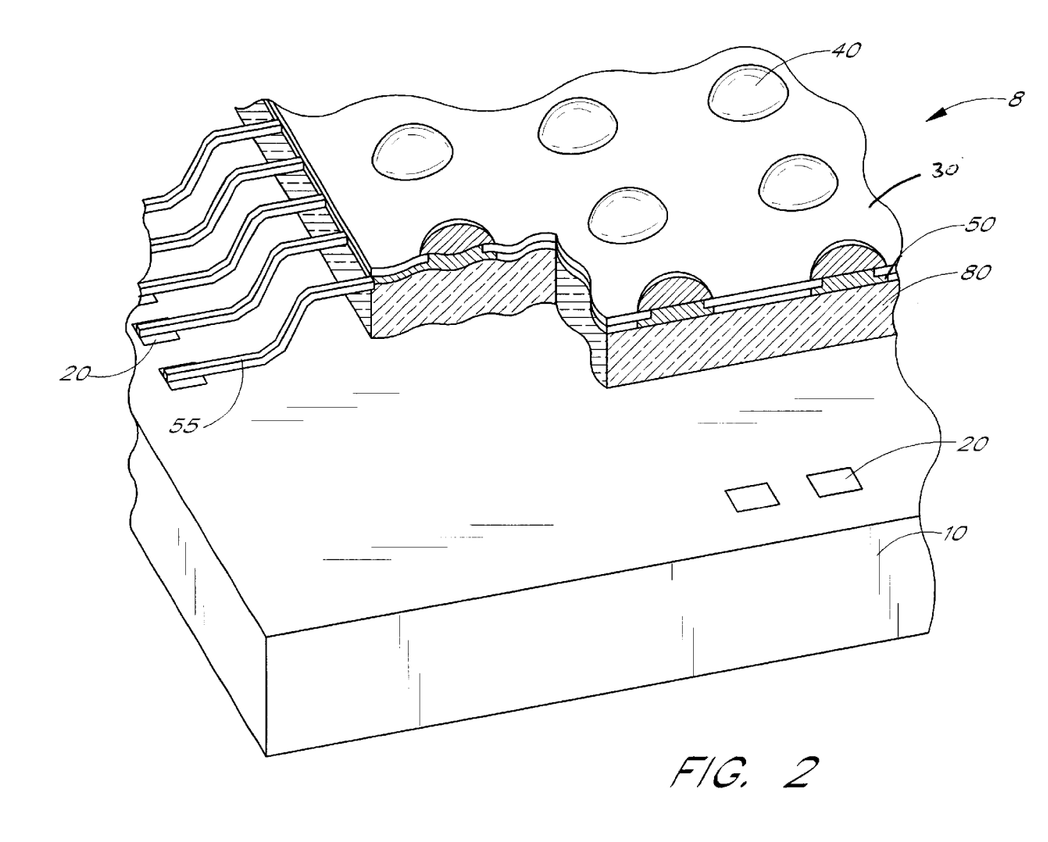
FIG. 2 is a perspective view of a μBGA package.
Figure 3:
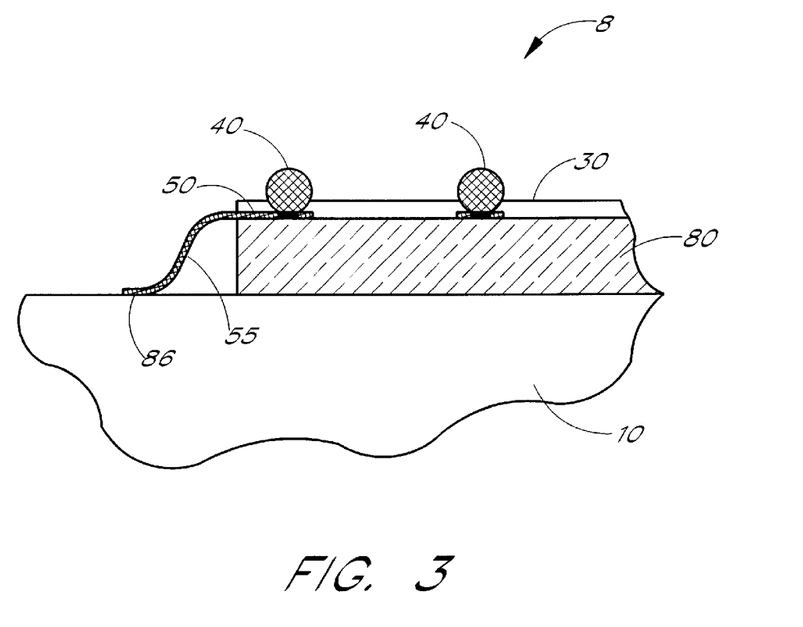
FIG. 3 is a cross-sectional view of a μBGA package.

FIGS. 2 and 3 illustrate one embodiment of the present invention in which a first level package 8 is provided, wherein like components are numbered in accordance with FIGS. 1A–1D above. In the IC packaging industry, it is common to refer to the placement of the IC chip within a suitable package as "1st level" packaging. The placement or mounting of the IC package on a suitable printed circuit board (PCB) or other substrate, is referred to as "2nd level" packaging. The interconnection of the various PCBs or other carriers within an electronic system, e.g., through use of a motherboard, is referred to as "3rd level" packaging.

Figure 5:
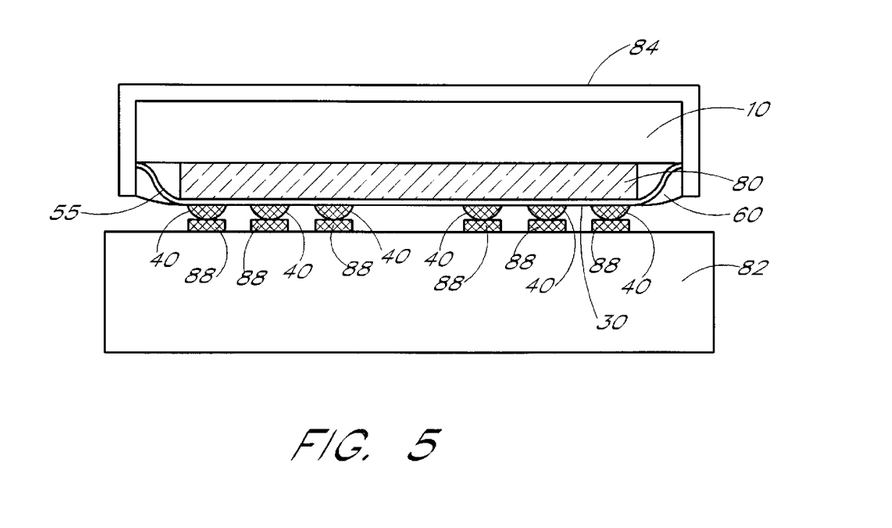
FIG. 5 is a cross-sectional view of a first level package being attached to a second level package.
Figure 6:
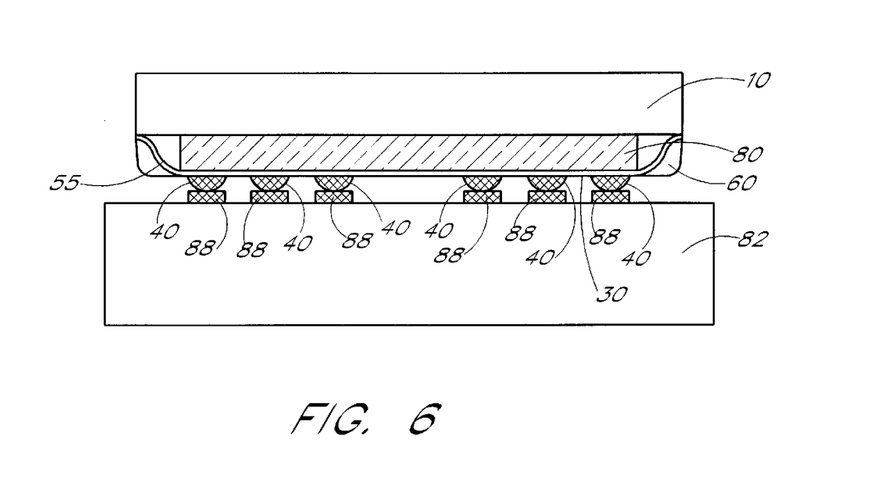
FIG. 6 is a cross-sectional view of the first level package of FIG. 5, shown without the first level package case.

The package 8 is preferably a ball grid array (BGA) package having a plurality of solder balls 40 that interconnect the package to a printed circuit board (see FIGS. 5 and 6). More preferably, the BGA package 8 is a TBGA package, and is even more preferably a μBGA package. As shown in FIGS. 2 and 3, in this package 8, a die or chip 10 is prepared for bonding with a second level package. As shown in FIG. 5, the integrated circuit die 10 of the BGA package is mounted to a printed circuit board 82 through solder pads 88 and enclosed by a rigid housing or lid 84, typically constructed from a molded plastic material. FIG. 6 illustrates an alternative embodiment of the μBGA package without a package case 84.

The die 10 will be understood by one of ordinary skill in the art to be one of many different types of integrated circuit. For example, the die 10 can be from a wide range of integrated circuit products, such as microprocessors, co-processors, digital signal processors, graphics processors, microcontrollers, memory devices, reprogrammable devices, programmable logic devices, and logic arrays, etc.

A die attach material 80 is provided over the central portion of the die 10. A solder ball array 40 is provided over the die attach material. The solder ball array 40 serves to make the connection to the next-level package. The die attach material 80 may be a silicone elastomer, or more preferably, is an epoxy-modified elastomeric material such as described in assignee's copending application entitled DIE ATTACH MATERIAL FOR TBGA OR FLEXIBLE CIRCUITRY, U.S. patent application Ser. No. 09/471,071 filed Dec. 21, 1999, the entirety of which is hereby incorporated by reference. The solder balls 40 are preferably relatively flexible and can thus compensate for any lack of flatness in the printed circuit board or package. Additionally, the solder balls are assembled in an array, and thus provide a relatively high throughput. In one preferred embodiment, the solder balls are made of a tin/lead (SnPb) eutectic material such as Sn63Pb37 and have a diameter of about 0.3 to 0.5 mm.

The tape or interposer 30 extends over the die attach material 80 to form a connection with the solder ball array 40. The bump pitch of the solder balls 40 on the tape 30 can be as small as about 0.25 to 1 mm, and is more preferably about 0.5 mm. Leads 50 extend from the tape 30 to form a connection with the die 10 at die pads 20. The leads are preferably made of Au wire, and are preferably bonded thermosonically in a lazy-S shape in expansion section 55 to accommodate deformation due to thermal expansion.

Figure 4:
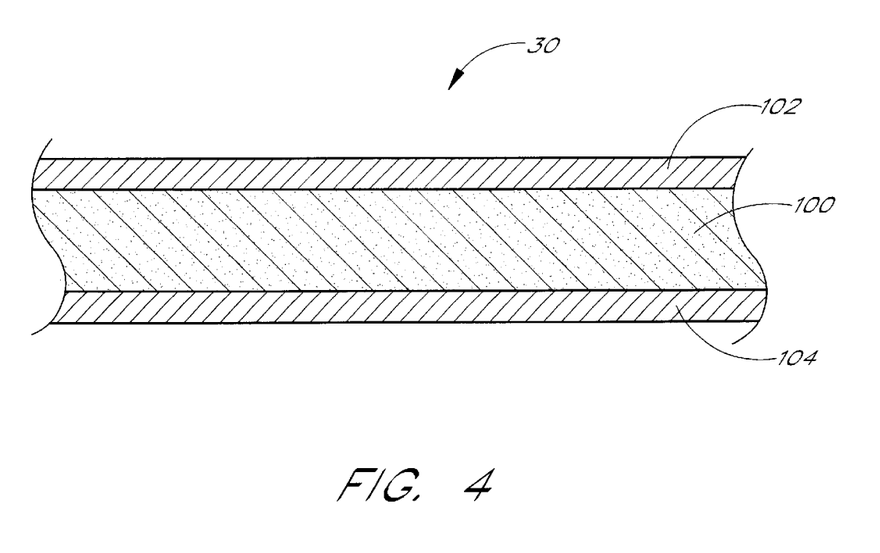
FIG. 4 is a cross-sectional view of a preferred interposer of the present invention.

FIG. 4 illustrates more particularly in cross-section the interposer or tape 30. The tape 30 preferably includes a composite polyimide core 100 and conductive traces 102 and 104, which are preferably made of copper. The polyimide core 100 preferably has a thickness of about 25 $\mu$m. The copper traces preferably have a thickness of about 12 $\mu$m. The core material is preferably Upilex-S, available from Ube, Japan.

The polyimide core 100 more preferably includes a thermally conductive, electronically nonconductive filler such as boron nitride or alumina. It will be appreciated that other inorganic materials having high thermal conductivity may also be used, including but not limited to silica, silicon nitride and aluminum nitride. In addition, metallic filler may also be used if it does not affect the circuitry signal integrity. The filler is preferably added by blending the filler material into the polyimide resin system prior to film formation, such as in an extrusion method or a coating method. The filler preferably has an average diameter of about 75 $\mu$m or less, more preferably less than about 50 $\mu$m. Filler may preferably be added to the core in the amount of about 10 to 95% by weight. In one preferred embodiment, about 50% filler by weight may be added to the polyimide core.

Adding the filler to the core 100 advantageously increases the thermal conductivity of the interposer. For example, adding filler to the core preferably increases thermal conductivity by about 50%, more preferably about 500%, as compared to that of the polyimide core above. For example, whereas a polyimide film alone may have a thermal conductivity of about 0.2 W/mK, with preferred amounts of filler, the thermal conductivity increases to about 0.3 to 1 W/mK or more. More preferably, the thermal conductivity of the polyimide core with the filler is about 0.5 W/mK or more. This therefore enables more efficient cooling of the interposer during operation, and allows the device to be more accurately temperature-controlled.

Moreover, the filler advantageously decreases the coefficient of thermal expansion (CTE) of the interposer to more closely approximate the CTE of the die. In one example, a polyimide core without a filler has a coefficient of thermal expansion of about 20 ppm/° C. By adding about 30% of a $SiO_2$ filler, the CTE of the core is reduced to about 15 to 17 ppm/° C. or less to more closely resemble a die having a CTE of about 3 ppm/° C. In other embodiments, a composite polyimide core having a CTE of about 3 to 10 ppm/° C. may be formed. In general, filler may be added to the polyimide core to reduce the CTE of the core by at least about 10%, more preferably about 25%.

The reduced CTE of the interposer advantageously more closely matches the CTE of the die. This in turn reduces the stresses placed on the tape 30, and more particularly on the leads 50, during thermal cycling. The overall package is thus more resistant to breakage of the wire and the corresponding loss in electrical connection. Moreover, the reduced CTE of the interposer prevents delamination of the die attach layer 80 from either the die or the interposer. Additionally, in conventional fabrication processes using a metal frame to carry the interposer, the metal frame typically is exposed to the entire assembly process, including the high temperature post die attach cure, wire bond, encapsulation cure and solder ball placement. Thus, reducing the coefficient of thermal expansion of the interposer also more closely matches the CTE of the interposer to the CTE of the metal carrier, which, for example, has a CTE of about 17 ppm/° C. when made of a copper material. This therefore prevents the interposer from delaminating from the metal carrier.

The presence of the filler in the polyimide core 100 also preferably increases the rigidity of the interposer. For example, in one embodiment, when about 30% of $SiO_2$ filler is used, the tape 100 has a modulus of about 10 GPa at 25° C. In other embodiments, the modulus may range from about 10 to 50 GPa.

The increased rigidity of the tape 100 advantageously makes the tape easier to handle during fabrication of the package. With conventional tapes, having a modulus in the range of about 4.5 to 8 GPa for example, during assembly of the package the interposer is carried using a metal frame as described above. The composite interposer of the preferred embodiments, by contrast, has a higher modulus which may eliminate the need to use a metal frame. For example, filler may be added so that the modulus of the interposer is about 5 and 500% higher than the modulus of the polyimide core alone. This thereby simplifies manufacture, and the increased rigidity of the tape makes it possible to handle the tape directly by a machine without using a metal frame. Elimination of the metal frame helps the process accuracy and reduces handling and costs.

Moreover, the more rigid interposer of the preferred embodiments also prevents die delamination. This is because a more rigid interposer can be made flatter and can therefore be adhered to the die attach material more effectively.

It will be appreciated that the interposer described herein may be used not only in μBGA packages, but also in other integrated circuit packages as well. Other types of integrated circuit package applications as would be known by one of skill in the art include, but are not limited to, any package using a flexible substrate. Examples include Chip-on-flex, $D^2BGA$ and BOCBGA with flexible substrates.

The embodiments illustrated and described above are provided merely as examples of certain preferred embodiments of the present invention. Various changes and modifications can be made from the embodiments presented herein by those skilled in the art without departure from the spirit and scope of the invention, as defined by the appended claims.

What is claimed is:

1. A flexible tape comprising a polyimide layer and a filler material, wherein the filler material increases the thermal conductivity of the tape by about 50% or more as compared to the thermal conductivity of the polyimide layer alone.

2. The flexible tape of claim 1, wherein the filler material reduces the coefficient of thermal expansion (CTE) of the tape as compared to the CTE of the polyimide layer alone.

3. The flexible tape of claim 2, wherein the filler material reduces the coefficient of thermal expansion (CTE) of the tape by about 10% or more as compared to the CTE of the polyimide layer alone.

4. The flexible tape of claim 1, wherein the filler material increases the modulus of elasticity of the tape as compared to the modulus of elasticity of the polyimide layer alone.

5. The flexible tape of claim 4, wherein the filler material increases the modulus of elasticity of the tape by about 10% or more as compared to the modulus of the polyimide layer alone.

6. The flexible tape of claim 1, wherein the filler material is alumina.

7. The flexible tape of claim 1, wherein the filler material has an average diameter of less than about 74 μm.

8. An integrated circuit package, comprising:
   a die;
   a die attach layer over the die;
   an array of package terminals over the die attach layer; and
   a composite tape between the die attach layer and the array of package terminals,
wherein the composite tape comprises a polyimide core and a filler embedded therein that increases the thermal conductivity of the tape by about 50% or more as compared to the thermal conductivity of the polyimide core alone, and further comprises a layer of metal wire electrically connected to the die.

9. The package of claim 8, wherein the filler is electrically nonconductive.

10. The package of claim 8, wherein the filler is inorganic.

11. The package of claim 8, wherein the filler is alumina.

12. The package of claim 8, wherein the filler is silica.

13. The package of claim 8, comprising between about 10% and 95% filler by weight.

14. The package of claim 8, comprising about 30 to 50% filler by weight.

15. The integrated circuit package of claim 8, wherein the filler reduces the coefficient of thermal expansion of the composite tape by about 10% or more as compared to that of the polyimide core alone.

16. The integrated circuit package of claim 8, wherein the filler increases the modulus of elasticity of the composite tape by about 10% or more as compared to the modulus of the polyimide core alone.

17. The package of claim 8, wherein the package is a ball grid array (BGA) package.

18. Then package of claim 8, wherein the package is a micro-ball grid array (μBGA) package.

19. A flexible tape comprising a polyimide core and a filler material, wherein the filler material reduces the coefficient of thermal expansion (CTE) of the tape by about 10% or more as compared to the CTE of the polyimide core alone.

20. The flexible tape of claim 19, wherein the filler material increases the modulus of elasticity of the tape by about 10% or more as compared to the modulus of elasticity of the polyimide core alone.

21. A flexible tape comprising a polyimide core and a filler material, wherein the filler material increases the modulus of elasticity of the tape by about 10% or more as compared to the modulus of elasticity of the polyimide core alone.

22. A flexible tape comprising a polyimide core and a silicon nitride filler material, wherein the silicon nitride filler material increases the thermal conductivity of the tape as compared to the thermal conductivity of the polyimide core alone.

23. The flexible tape of claim 22, wherein the silicon nitride filler material reduces the coefficient of thermal expansion (CTE) of the tape by about 10% or more as compared to the CTE of the polyimide core alone.

24. The flexible tape of claim 22, wherein the silicon nitride filler material increases the modulus of elasticity by about 10% or more as compared to the modulus of elasticity of the polyimide core alone.

25. The flexible tape of claim 10, wherein the filler material increases the thermal conductivity of the tape by about 50% or more as compared to the thermal conductivity of the polyimide core alone.

26. The flexible tape of claim 21, wherein the filler material increases the thermal conductivity of the tape by about 50% or more as compared to the thermal conductivity of the polyimide core alone.

27. The flexible tape of claim 22, wherein the silicon nitride filler material increases the thermal conductivity of the tape by about 50% or more as compared to the modulus of elasticity of the polyimide core alone.

28. An integrated circuit package, comprising:
   a die;
   a die attach layer over the die;
   an array of package terminals over the die attach layer; and
   a composite tape between the die attach layer and the array of package terminals,
wherein the composite tape comprises a polyimide core and a thermally conductive filler embedded therein that reduces the coefficient of thermal expansion (CTE) of the tape by about 10% or more as compared to the CTE of the polyimide core alone, and further comprises a layer of metal wire electrically connected to the die.

29. The integrated circuit package of claim 28, wherein the filler material increases the modulus of elasticity of the tape by about 10% or more as compared to the modulus of elasticity of the polyimide core alone.

30. An integrated circuit package, comprising:
   a die;
   a die attach layer over the die;
   an array of package terminals over the die attach layer; and
   a composite tape between the die attach layer and the array of package terminals,
wherein the composite tape comprises a polyimide core and a thermally conductive filler embedded therein that increases the modulus of elasticity of the tape by about 10% or more as compared to the modulus of elasticity of the polyimide core alone, and further comprises a layer of metal wire electrically connected to the die.

31. An integrated circuit package, comprising:
   a die;
   a die attach layer over the die;
   an array of package terminals over the die attach layer; and
   a composite tape between the die attach layer and the array of package terminals,
wherein the composite tape comprises a polyimide core and a thermally conductive nitride filler material, and further comprises a layer of metal wire electrically connected to the die.

32. The integrated circuit package of claim 31, wherein the filler material is boron nitride.

33. The integrated circuit package of claim 31, wherein the filler material is silicon nitride.

34. The integrated circuit package of claim 31, wherein the filler material is aluminum nitride.

35. The integrated circuit package of claim 31, wherein the filler material increases the thermal conductivity of the tape by about 50% or more as compared to the thermal conductivity of the polyimide core alone.

36. The integrated circuit package of claim 31, wherein the filler material reduces the coefficient of thermal expansion (CTE) of the tape by about 10% or more as compared to the CTE of the polyimide core alone.

37. The integrated circuit package of claim 31, wherein the filler material increases the modulus of elasticity of the tape by about 10% or more as compared to the modulus of elasticity of the polyimide core alone.

* * * * *